(12) United States Patent
Joshi et al.

(10) Patent No.: US 10,403,594 B2
(45) Date of Patent: Sep. 3, 2019

(54) HYBRID BONDING MATERIALS COMPRISING BALL GRID ARRAYS AND METAL INVERSE OPAL BONDING LAYERS, AND POWER ELECTRONICS ASSEMBLIES INCORPORATING THE SAME

(71) Applicant: Toyota Motor Engineering & Manufacturing North America, Inc., Erlanger, KY (US)

(72) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 15/876,929

(22) Filed: Jan. 22, 2018

(65) Prior Publication Data
US 2019/0229083 A1 Jul. 25, 2019

(51) Int. Cl.
*C09J 7/10* (2018.01)
*H01L 23/00* (2006.01)

(52) U.S. Cl.
CPC ............... *H01L 24/73* (2013.01); *C09J 7/10* (2018.01); *H01L 24/14* (2013.01); *H01L 24/17* (2013.01);
(Continued)

(58) Field of Classification Search
CPC ......... H01L 24/73; H01L 24/14; H01L 24/17; H01L 24/29; H01L 24/32; H01L 24/81;
(Continued)

(56) References Cited

U.S. PATENT DOCUMENTS

| 6,087,021 A * | 7/2000 | Gaynes ............... H05K 3/321 228/175 |
| 6,288,451 B1* | 9/2001 | Tsao ................. H01L 21/563 257/738 |

(Continued)

FOREIGN PATENT DOCUMENTS

| DE | 1945899 A1 * | 3/1970 | .......... H01J 23/0057 |
| JP | 09064237 A * | 3/1997 | ............ H01L 23/28 |
| WO | 1997001866 A1 | 1/1997 | |

OTHER PUBLICATIONS

Dusseault, Thomas J. et al., "Inverse opals for fluid delivery in electronics cooling system," Stanford University, URL: https://nanoheat.stanford.edu/sites/default/files/publications/dusseault_final.pdf.
(Continued)

*Primary Examiner* — Ida M Soward
(74) *Attorney, Agent, or Firm* — Dinsmore & Shohl LLP (57) ABSTRACT

A hybrid bonding layer includes a metal inverse opal (MIO) layer with a plurality of hollow spheres and a predefined porosity, and a ball grid array (BGA) disposed within the MIO layer. The MIO layer and the BGA may be disposed between a pair of bonding layers. The MIO layer and the BGA each have a melting point above a TLP sintering temperature and the pair of bonding layers each have a melting point below the TLP sintering temperature such that the hybrid bonding layer can be transient liquid phase bonded between a substrate and a semiconductor device. The pair of bonding layers may include a first pair of bonding layers with a melting point above the TLP sintering temperature and a second pair of bonding layers with a melting point below the TLP sintering temperature.

20 Claims, 10 Drawing Sheets

(52) U.S. Cl.
CPC .............. *H01L 24/29* (2013.01); *H01L 24/32* (2013.01); *H01L 24/81* (2013.01); *H01L 24/83* (2013.01); *H01L 2224/81855* (2013.01); *H01L 2224/81885* (2013.01); *H01L 2224/8384* (2013.01); *H01L 2924/013* (2013.01); *H01L 2924/01013* (2013.01); *H01L 2924/01025* (2013.01); *H01L 2924/01028* (2013.01); *H01L 2924/01029* (2013.01)

(58) Field of Classification Search
CPC ... H01L 24/83; H01L 2224/81855; C09J 7/10
See application file for complete search history.

(56) References Cited

U.S. PATENT DOCUMENTS

| | | | |
|---|---|---|---|
| 6,565,969 | B1 | 5/2003 | Lamon et al. |
| 7,227,267 | B2 * | 6/2007 | Lee .......................... H01L 24/29 257/778 |
| 8,319,098 | B2 * | 11/2012 | Duerr ................... H01G 9/2031 136/250 |
| 9,044,822 | B2 | 6/2015 | Yoon et al. |
| 9,198,302 | B2 | 11/2015 | Elger |
| 9,673,182 | B2 * | 6/2017 | Huang ................. H01L 23/3135 |
| 9,738,056 | B2 * | 8/2017 | Joshi ........................... B32B 7/04 |
| 9,905,532 | B2 * | 2/2018 | Joshi ........................ H01L 24/83 |
| 2008/0042253 | A1 * | 2/2008 | Yoo ..................... H01L 25/0657 257/686 |
| 2008/0224312 | A1 * | 9/2008 | Beyne ................. H01L 23/3128 257/738 |
| 2009/0053859 | A1 * | 2/2009 | Xu ............................ H01B 1/22 438/118 |
| 2009/0113685 | A1 * | 5/2009 | Xu ............................ B41J 2/161 29/25.35 |
| 2010/0129961 | A1 * | 5/2010 | Horibe .................... H01L 24/29 438/109 |
| 2014/0312501 | A1 * | 10/2014 | Liang ...................... B32B 27/16 257/773 |
| 2016/0108204 | A1 * | 4/2016 | Joshi ........................ C08K 3/08 428/557 |
| 2017/0095891 | A1 * | 4/2017 | Anderson ............ B23K 35/262 |
| 2017/0263586 | A1 | 9/2017 | Joshi et al. |
| 2017/0271294 | A1 * | 9/2017 | Chen ....................... H01L 24/29 |
| 2019/0078212 | A1 * | 3/2019 | Joshi .................... C23C 18/1633 |

OTHER PUBLICATIONS

Dume, Belle, "Heat conduction goes ballistic in opals," nanotechweb.org, Technology Update, Apr. 7, 2016, URL: https://web.archive.org/web/20170916135716/http://nanotechweb.org/cws/article/tech/64569.

* cited by examiner

HYBRID BONDING MATERIALS COMPRISING BALL GRID ARRAYS AND METAL INVERSE OPAL BONDING LAYERS, AND POWER ELECTRONICS ASSEMBLIES INCORPORATING THE SAME

TECHNICAL FIELD

The present specification generally relates to bonding materials, and more particularly, to hybrid bonding materials that bond semiconductor devices to substrates while providing thermal stress compensation between the semiconductor devices and the substrates during the manufacture of power electronics assemblies.

BACKGROUND

Power electronics devices are often utilized in high-power electrical applications, such as inverter systems for hybrid electric vehicles and electric vehicles. Such power electronics devices include power semiconductor devices, such as power IGBTs and power transistors thermally bonded to a substrate. The substrate may then be further thermally bonded to a cooling structure, such as a heat sink.

With advances in battery technology and increases in electronics device packaging density, operating temperatures of power electronics devices have increased and are currently approaching 200° C. Accordingly, traditional electronic device soldering techniques no longer provide suitable bonding of semiconductor devices to substrates and alternative bonding techniques are needed. One such alternative bonding technique is transient liquid phase (TLP) sintering (also referred to herein as "TLP bonding"). The TLP sintering of a power electronics device utilizes a bonding layer disposed (sandwiched) between a semiconductor device and substrate. The bonding layer at least partially melts and isothermally solidifies to form a TLP bond between the semiconductor device and substrate at TLP bonding temperatures (also referred to as sintering temperatures) between about 280° C. to about 350° C. The semiconductor devices and substrates have different coefficients of thermal expansion (CTE) and large thermally-induced stresses (e.g., cooling stresses) may be generated between a semiconductor device and substrate upon cooling from a TLP sintering temperature. The large thermal cooling stresses due to CTE mismatch between the power semiconductor device and substrate may result in delamination between the semiconductor device and substrate of a power electronics device when currently known bonding layers are used to form the TLP bond.

SUMMARY

In one embodiment, a hybrid bonding layer includes a metal inverse opal (MIO) layer and a ball grid array (BGA) formed from a plurality of balls disposed within the MIO layer. The MIO may be a copper metal inverse opal (CIO) layer and the plurality of balls of the BGA may be formed from at least one of aluminum, nickel, copper, manganese, tin, and alloys thereof. In some embodiments, the BGA is formed from a plurality of core-shell balls. In such embodiments, the plurality of core-shell balls include a core formed from at least one of aluminum, nickel, copper, manganese, and alloys thereof, and a shell formed from at least one of aluminum, nickel, copper, manganese, tin, and alloys thereof. In embodiments, the hybrid bonding layer may be sandwiched between a pair of low melting point bond layers. In such embodiments, the pair of low melting point bond layers have a melting point below a TLP sintering temperature and the BGA and the MIO layer have a melting point above the TLP sintering temperature. In one embodiment, the TLP sintering temperature may be between about 280° C. and 350° C. and the pair of low melting point bond layers may be formed from tin and alloys thereof with a melting point below 280° C.

In another embodiment, a power electronics assembly includes a substrate, a semiconductor device, and a hybrid bonding layer disposed between and bonded to the semiconductor device and the substrate. The hybrid bonding layer includes a metal inverse opal (MIO) layer and a ball grid array (BGA) disposed within the MIO layer. The MIO layer may be a copper metal inverse opal (CIO) layer and the BGA may be a plurality of balls formed from at least one of aluminum, nickel, copper, manganese, tin, and alloys thereof. In some embodiments, the BGA is a plurality of core-shell balls. In such embodiments, the plurality of core-shell balls may have a core formed from at least one of aluminum, nickel, copper, manganese, and alloys thereof, and a shell formed from at least one of aluminum, nickel, copper, manganese, tin, and alloys thereof. A first intermetallic layer may be between the hybrid bond layer and the substrate and a second intermetallic layer may be between the hybrid bond layer and the semiconductor device.

In yet another embodiment, a process for manufacturing a power electronics assembly includes positioning a hybrid bonding layer between a substrate and a semiconductor device to provide a substrate/semiconductor device assembly. The hybrid bonding layer includes a metal inverse opal (MIO) layer and a ball grid array (BGA) disposed within the MIO layer. The substrate/semiconductor device assembly is heated to a transient liquid phase (TLP) sintering temperature between about 280° C. and 350° C. and the hybrid bond layer is TLP bonded between and to the substrate and the semiconductor device. In embodiments, the MIO layer is formed around the BGA. In other embodiments, the MIO layer is formed with a plurality of hollow spaces for the BGA to be positioned and the BGA is positioned within the hollow spaces to form the hybrid bonding layer. The hybrid bonding layer may be sandwiched between a pair of low melting point bond layers that have a melting point less than 280° C. and the pair of low melting point bond layers at least partially melt and isothermally solidify during heating of the substrate/semiconductor device assembly to the TLP sintering temperature.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

A power electronics assembly with a power semiconductor device (semiconductor device) bonded to a substrate with a hybrid bonding layer that compensates for thermally-induced stresses generated or resulting from fabrication and operation of the power electronics assembly is provided. The thermally-induced stresses are due to coefficient of thermal expansion (CTE) mismatch between the semiconductor device and the substrate of the power electronics assembly. The hybrid bonding layer comprises a metal inverse opal (MIO) layer with a plurality of hollow spheres and a predefined porosity, and a ball grid array (BGA) disposed within the MIO layer. As used herein, the phrase "ball grid array" and the term BGA refer to a an arrangement, uniform or non-uniform, of a plurality of balls (spheres). As used herein, the term "uniform" or "uniformly" refers to an ordered arrangement of a plurality of balls with an equal distance between balls in rows and/or columns of the ordered arrangement and/or an array of balls with no balls missing from the array. The term "non-uniform" or "non-uniformly" refers to a disordered arrangement of a plurality of balls with an unequal distance between balls in rows and/or columns of the disordered arrangement and/or an array of balls with balls missing from the array. The hybrid bonding layer may include a pair of bonding layers that extend across the MIO layer and the BGA disposed within the MIO layer such that the MIO layer and the BGA are disposed between the pair of bonding layers. The BGA and the MIO layer each have a melting point that is greater than a transient liquid phase (TLP) sintering temperature and the pair of bonding layers have a melting point that is less than the TLP sintering temperature used to form a TLP bond between the semiconductor device, the hybrid bonding layer and the substrate. The MIO layer and BGA compensate for the thermally induced stresses between the semiconductor device and the substrate thereby reducing or eliminating stress and failures at TLP bonds between semiconductor device, hybrid bonding layer, and substrate. Various embodiments of hybrid bonding layers and power electronics assemblies using hybrid bonding layers will be described in more detail herein.

Figure 1:
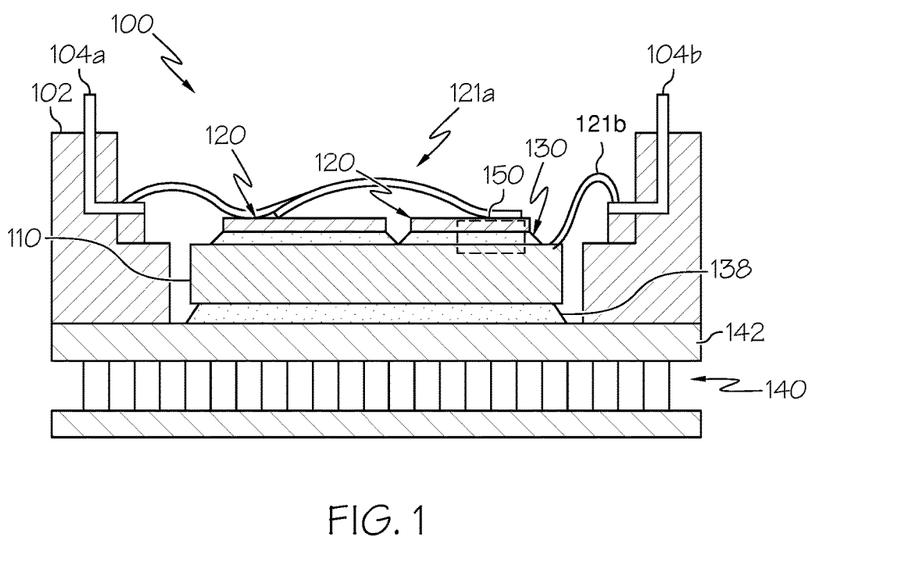
FIG. 1 schematically depicts a side view of a power electronics assembly having a power semiconductor device bonded to a substrate with a hybrid bonding layer according to one or more embodiments shown and described herein.

Referring initially to FIG. 1, as a non-limiting example, a power electronics assembly 100 is schematically illustrated. The power electronics assembly 100 generally comprises a substrate 110, two semiconductor devices 120 bonded to the substrate 110 via a hybrid bonding layer 130, a cooling structure 140, and a package housing 102.

The thicknesses of the substrate 110 and the semiconductor devices 120 may depend on the intended use of the power electronics assembly 100. In one embodiment, the substrate 110 has a thickness within the range of about 2.0 mm to about 4.0 mm, and the semiconductor device 120 has a thickness within the range of about 0.075 mm to about 0.3 mm. For example and without limitation, the substrate 110 may have a thickness of about 3.0 mm and the semiconductor device 120 may have a thickness of about 0.2 mm. It should be understood that other thicknesses may be utilized.

The substrate 110 may be formed from a thermally conductive material such that heat from the semiconductor devices 120 is transferred to the cooling structure 140. The substrate 110 may any type of substrate for power semiconductor device assemblies known to those skilled in the art. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. The semiconductor devices 120 may be formed from a wide band gap semiconductor material suitable for the manufacture or production of power semiconductor devices such as power insulated-gate bipolar transistors (IGBTs) and power transistors. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), gallium oxide ($Ga_2O_3$), boron nitride (BN), diamond, and the like. In embodiments, the substrate 110 and the semiconductor devices 120 may comprise a coating, e.g., nickel (Ni) plating, to assist in the TLP sintering of the semiconductor devices 120 to the substrate 110.

As depicted in FIG. 1, a substrate 110 is bonded to two semiconductor devices 120 via the hybrid bonding layer 130. More or fewer semiconductor devices 120 may be attached to the substrate 110. In some embodiments, heat generating devices other than power semiconductor devices may be attached to the substrate 110. The semiconductor devices 120 may be power semiconductor devices such as IGBTs, power diodes, power metal-oxide-semiconductor field-effect transistors (MOSFETs), power transistors, and the like. In one embodiment, the semiconductor devices 120 of one or more power electronics assemblies are electrically coupled to form an inverter circuit or system for vehicular applications, such as for hybrid vehicles or electric vehicles, for example.

The substrate 110 is thermally coupled to the cooling structure 140 via a bond layer 138. In one embodiment, the cooling structure 140 comprises an air-cooled heat sink. In an alternative embodiment, the cooling structure 140 comprises a liquid-cooled heat sink, such as a jet impingement or channel-based heat sink device. The substrate 110 of the illustrated embodiment is directly bonded to a first surface 142 of the cooling structure 140 via the bond layer 138 without any additional interface layers (e.g., additional metal base plates). The substrate 110 may be bonded to the cooling structure 140 using a variety of bonding techniques, such as by TLP sintering, solder, brazing, or diffusion bonding, for example. However, in an alternative embodiment, one or more thermally conductive interface layers may be positioned between the substrate 110 and the cooling structure 140.

Still referring to FIG. 1, the substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example. In other embodiments, no package housing is provided.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 121a, and the second electrical contact 104b is electrically coupled to a second surface of the semiconductor devices 120 via a second electrical wire 121b and the substrate 110. It should be understood that other electrical and mechanical configurations are possible, and that embodiments are not limited by the arrangement of the components illustrated in the figures.

Figure 2:
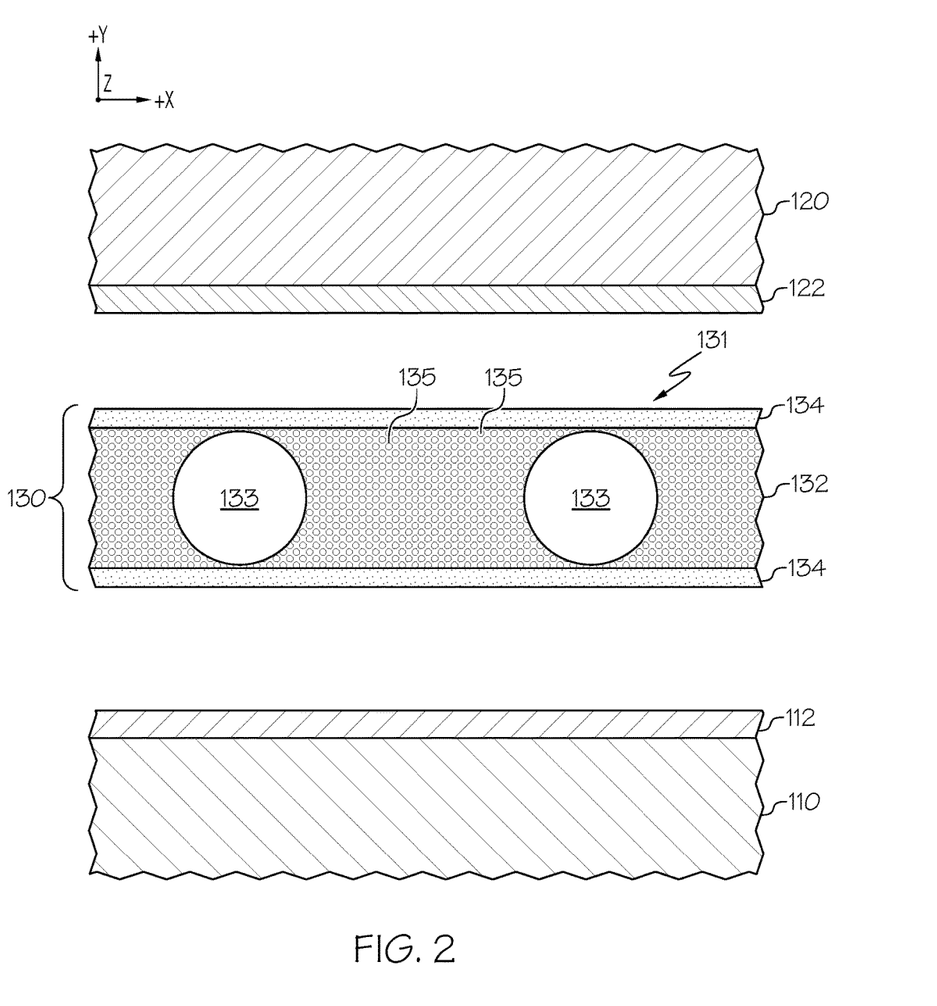
FIG. 2 schematically depicts an exploded view of the hybrid bonding layer in FIG. 1 according to one or more embodiments shown and described herein.

Referring now to FIG. 2, an exploded view of the region designated by box 150 in FIG. 1 before bonding the semiconductor devices 120 to the substrate 110 is schematically depicted. In embodiments, the semiconductor device 120 is TLP bonded to the substrate 110. In such embodiments, the substrate 110 may include a bonding layer 112, and the semiconductor device 120 may include a bonding layer 122. The hybrid bonding layer 130 comprises a BGA 131 disposed or embedded within an MIO layer 132 and a pair of bonding layers 134. The MIO layer 132 may be disposed between and in direct contact with the pair of bonding layers 134. The BGA 131 comprises a plurality of balls (spheres) 133 positioned at regular or non-regular intervals at least partially within the MIO layer 132. In some embodiments, the plurality of balls 133 are in direct contact with at least one of the pair of bonding layers 134. In other embodiments, the plurality of balls 133 are disposed within the MIO layer 132 such that the plurality of balls 133 are not in direct contact with at least one of the bonding layers 134.

Figure 3:
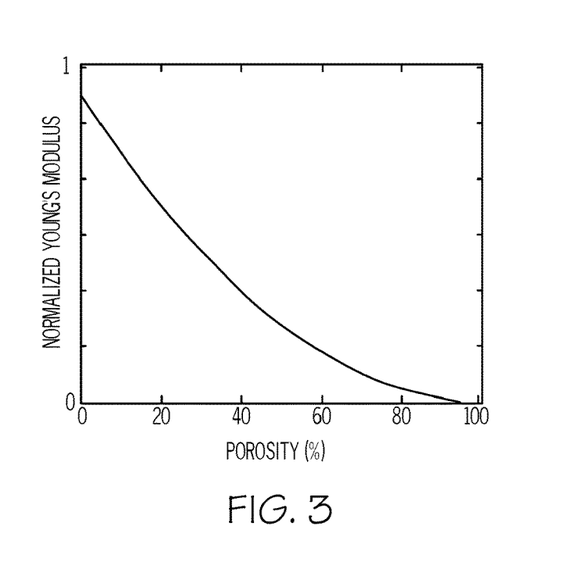
FIG. 3 graphically depicts normalized Young's modulus as a function of porosity in a metal inverse opal layer.

The MIO layer 132 has a plurality of hollow spheres 135 and a predefined porosity, that in combination with the BGA 131, provide a stiffness and thermal conductivity for the hybrid bonding layer 130. That is, in embodiments, a stiffness and thermal conductivity for the MIO layer 132 is a function of the porosity, i.e., the amount of porosity, of the MIO layer 132 and the and the plurality of balls 133 disposed within the MIO layer 132. As used herein, the term stiffness refers to the elastic modulus (also known as Young's modulus) of a material, i.e., a measure of a material's resistance to being deformed elastically when a force is applied to the material. The MIO layer 132 may be formed by depositing metal within a sacrificial template of packed microspheres and then dissolving the microspheres to leave a skeletal network of metal with a periodic arrangement of interconnected hollow spheres which may or may not be etched to increase the porosity and interconnection of the hollow spheres pores. The skeletal network of metal has a large surface area and the amount of porosity of the MIO layer 132 can be varied by changing the size of the sacrificial microspheres. Also, the size of the microspheres and thus the size of the hollow spheres can be varied as a function of thickness (Y direction) of the MIO layer 132 such that a graded porosity, i.e., graded hollow sphere diameter, is provided as a function of thickness is provided. As noted above, the Young's modulus (stiffness) and thermal conductivity of a MIO layer may be a function of porosity in the MIO layer. For example, FIG. 3 graphically depicts the Young's modulus thermal conductivity of a MIO layer as a function of porosity. Accordingly, the stiffness and thermal conductivity of the MIO layer 132 can be varied and controlled to accommodate thermal stress and heat transfer requirements for a given semiconductor device 120—substrate 110 combination. Also, a graded stiffness along the thickness of the MIO layer 132 can be provided to accommodate thermal stress for a given semiconductor device 120—substrate 110 combination.

As noted above, the plurality of balls 133 forming the BGA 131 are disposed within the MIO layer 132. The number and position of the plurality of balls 133 within the MIO layer 132 may be used to alter the stiffness and thermal properties of the MIO layer 132. That is, the properties of the plurality of balls 133, e.g., composition, density, etc., may alter the overall composition and/or porosity of the MIO layer 132 thereby altering its stiffness and thermal conductivity.

Figure 4:
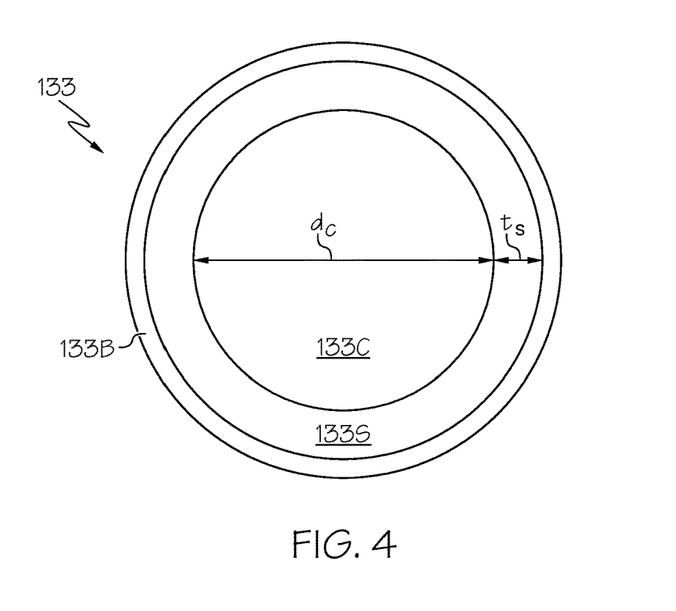
FIG. 4 schematically depicts a cross-sectional view of a ball (sphere) used to form a ball grid array according to one or more embodiments shown and described herein.

Referring to FIG. 4, in some embodiments, the plurality of balls 133 may comprise a plurality of core-shell balls 133 and an outer shell 133S with a thickness $t_s$. An inner core 133C has a diameter $d_c$ and the outer shell 133S has a thickness $t_s$, both of which may be varied to provide a desired stiffness and thermal conductivity for the plurality of balls 133, e.g., a stiffness and/or thermal conductivity that is less than, greater than, or general equal to the MIO layer 132. Also, the materials from which the inner core 133C and the outer shell 133S are formed may be chosen to provide a desired stiffness and/or thermal conductivity for the plurality of balls 133. In some embodiments, a bonding layer 133B may be included as discussed in greater detail below. While FIG. 4 schematically depicts a ball 133 for a BGA 131 having an inner core 133C and one outer shell 133S, it should be appreciate that the plurality of balls 133 may be formed from an inner core with more than one outer shell, a core with no outer shells, etc.

Figure 5A:
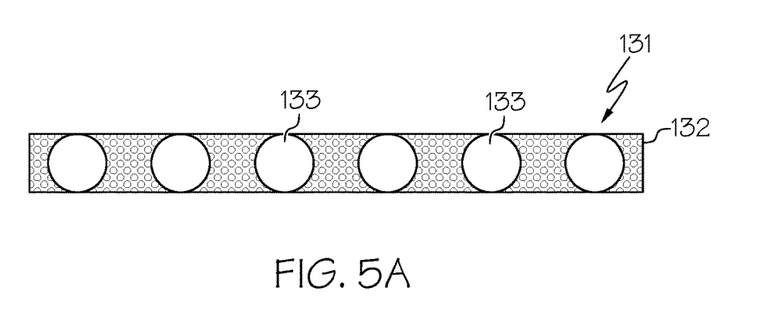
FIG. 5A schematically depicts a side view of the hybrid bonding layer in FIG. 1 with a ball grid array disposed within a metal inverse opal layer according to one or more embodiments shown and described herein.
Figure 5B:
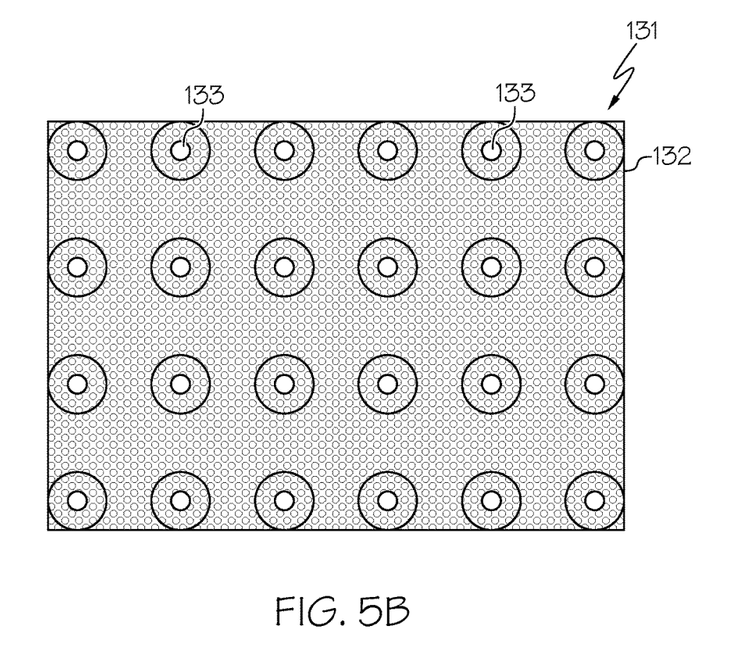
FIG. 5B schematically depicts a top view of the hybrid bonding layer in FIG. 5A.
Figure 6:
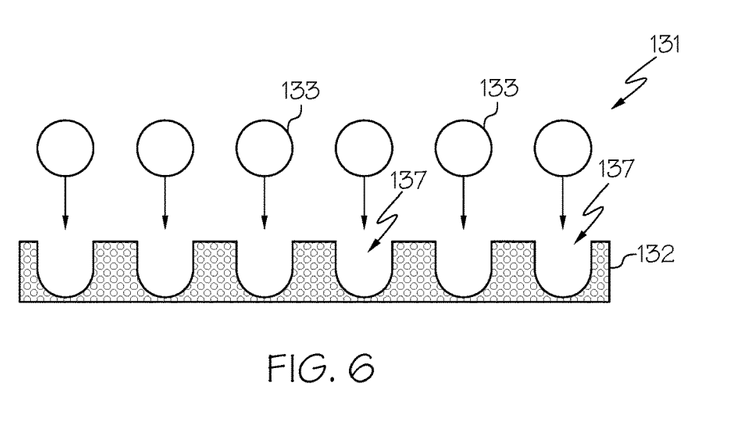
FIG. 6 schematically depicts an exploded side view of an metal inverse opal layer with a plurality of hollow spaces for a ball grid array to be positioned.
Figure 7A:
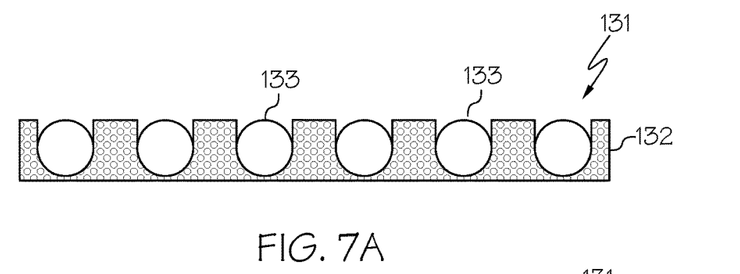
FIG. 7A schematically depicts a top view of the hybrid bonding layer in FIG. 6 with a ball grid array disposed within a metal inverse opal layer according to one or more embodiments shown and described herein.
Figure 7B:
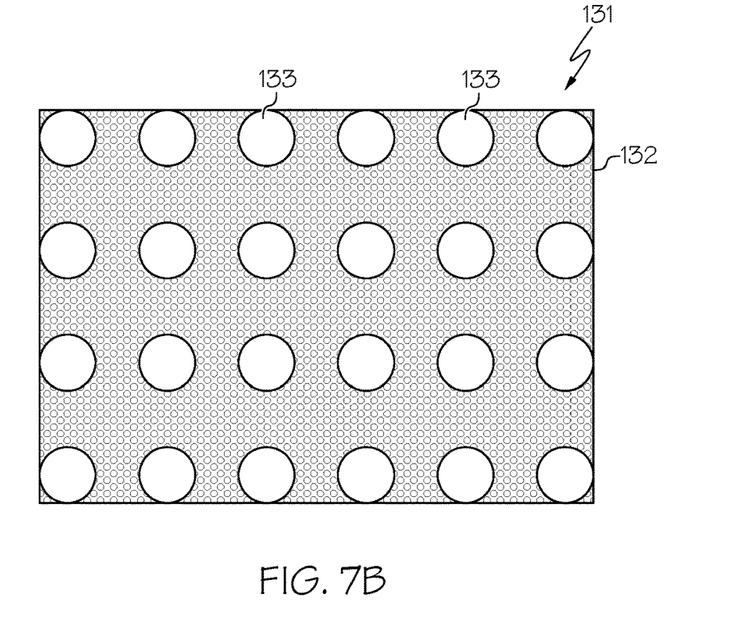
FIG. 7B schematically depicts a top view of the hybrid bonding layer in FIG. 7A.

Referring now to FIGS. 5A-5B, in some embodiments the MIO layer 132 may be formed around the plurality of balls 133 of the BGA 131. In such embodiments, a sacrificial template of packed microspheres is formed around the plurality of balls 133, metal is deposited within the sacrificial template, and the sacrificial template is dissolved to leave the MIO layer 132 with the BGA 131 there within. In other embodiments, the MIO layer 132 may be formed with a plurality of hollow spaces or openings 137 for the plurality of balls 133 of the BGA 131 to be positioned, either uniformly or non-uniformly, after the MIO layer 132 is formed as depicted in FIG. 6. In such embodiments, a sacrificial template of packed microspheres is formed around a BGA template (not shown) with a pattern for the BGA 131, metal is deposited within the sacrificial template, the BGA template is removed, and the sacrificial template is dissolved to leave an MIO layer 132 with the plurality of hollow spaces 137. FIGS. 7A-7B schematically depict a side view and a top view, respectively, of such an MIO layer 132 after the BGA 131 with the plurality of balls 133 have been positioned within the plurality of hollow spaces 137.

Figure 8:
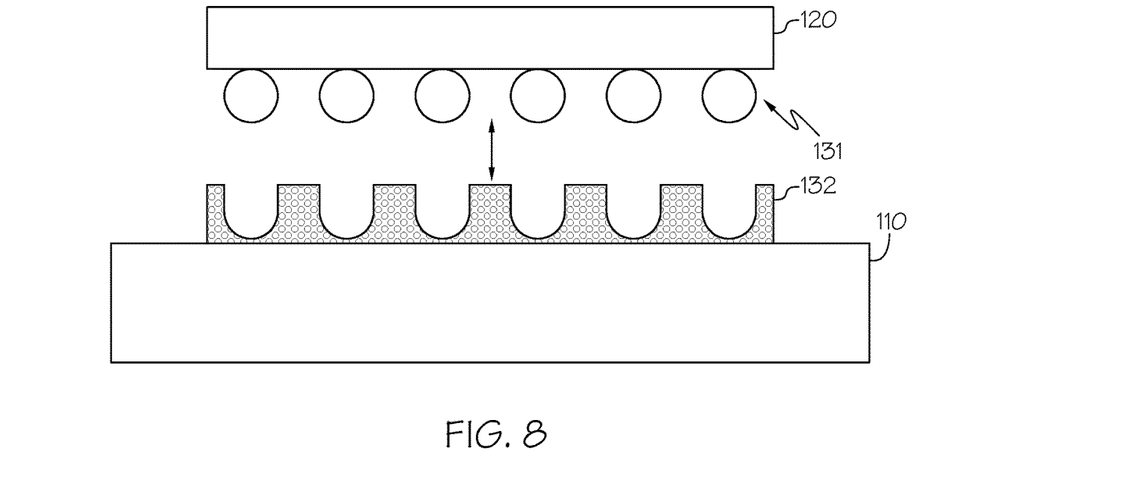
FIG. 8 schematically depicts the hybrid bonding layer in FIG. 6 with the ball grid array attached to a power semiconductor device and the metal inverse opal layer attached to a substrate prior to transient liquid phase bonding the power semiconductor device to the substrate.

Referring now to FIG. 8, embodiments of the hybrid bonding layer 130 as schematically depicted in FIGS. 6-7B, the BGA 131 may be attached to the semiconductor device 120 and the MIO layer 132 may be attached to the substrate 110 before TLP bonding of the substrate 110 to the semiconductor device 120. In other embodiments, the BGA 131 may be attached to the substrate 110 (not shown) and the MIO layer 132 may be attached to the semiconductor device 120 (not shown) before TLP bonding of the substrate 110 to the semiconductor device 120.

The bonding layer 133B (when included) on the plurality of balls 133 and the pair of bonding layers 134 each have a melting point that is less than a melting point of the MIO layer 132 and the plurality of balls 133. Particularly, the bonding layer 133B and the pair of bonding layers 134 each have a melting point that is less than a TLP sintering temperature used to TLP bond the semiconductor device 120 to the substrate 110, and the plurality of balls 133 and the MIO layer 132 each have a melting point that is greater than the TLP sintering temperature. As a non-limiting example, the TLP sintering temperature may be between about 280° C. and about 350° C., the bonding layer 133B and the pair of bonding layers 134 each have a melting point less than about 280° C., and the plurality of balls 133 and the MIO layer 132 each have a melting point greater than 350° C. For example, the bonding layer 133B and the pair of bonding layers 134 may be formed from tin (Sn) with a melting point of about 232° C., and the plurality of balls 133 and the MIO layer 132 may be formed from materials with a melting point greater than about 350° C. Non-limiting examples of materials used to form the plurality of balls 133 and the MIO layer 132 include metals such as Cu, Ni, Al, silver (Ag), zinc (Zn) and magnesium (Mg) with a melting point of about 1085° C., 660° C., 962° C., 420° C. and 650° C., respectively, and alloys thereof. Accordingly, the bonding layer 133B and the pair of bonding layers 134 at least partially melt and the plurality of balls 133 and the MIO layer 132 do not melt during TLP sintering of the semiconductor device 120 to the substrate 110. As used herein, the term "alloys thereof" does not limit alloys formed from only the elements listed unless stated otherwise. For example, the MIO layer 132 may be formed from alloys of Cu containing elements other than or in addition to Ni, Al, Ag, Zn, and/or Mg, alloys of Ni containing elements other than or in addition to Cu, Al, Ag, Zn, and/or Mg, and the like. In the alternative, the MIO layer 132 may be formed from alloys containing only Cu and Ni, Cu and Al, etc., and possibly incidental impurities present resulting from the manufacture of the Cu—Ni alloys, Cu—Al alloys, etc.

The hybrid bonding layer 130 described herein compensates thermally-induced stresses, e.g., thermal cooling stresses, resulting from fabrication (e.g., TLP sintering) and operational conditions (e.g., transient electric loads causing high changes in temperature). Because the substrate 110 and semiconductor devices 120 of the power electronics assembly 100 are made of differing materials, differences in the CTE for each material may cause large thermally-induced stresses within the substrate 110, semiconductor devices 120 and hybrid bonding layer 130. It should be understood that the large thermally-induced stresses may result in failure of the power electronics assembly 100 due to fracturing of the substrate 110 or failure of a traditional TLP bonding material (e.g., delamination) between the substrate 110 and one or both of the semiconductor devices 120. The use of the hybrid bonding layer 130 to TLP bond the substrate 110 to the semiconductor devices 120 alleviates or mitigates such stresses though enhanced structural compliance. That is, the hybrid bonding layer 130 described herein compensates for the thermal expansion and contraction experienced by the substrate 110 and semiconductor devices 120. In some embodiments, the hybrid bonding layer 130 described herein compensates for the thermal expansion and contraction experienced by the substrate 110 and semiconductor devices 120 with the MIO layer 132 having a generally constant stiffness and thermal conductivity between the substrate 110 and semiconductor devices 120. In other embodiments, the hybrid bonding layer 130 described herein compensates for the thermal expansion and contraction experienced by the substrate 110 and semiconductor devices 120 with the hybrid bonding layer 130 having a graded stiffness and thermal conductivity across its thickness. That is, a varied hollow sphere size (average diameter) and/or a non-uniform distribution of the plurality of balls 133 across the thickness of the MIO layer 132 provides a graded porosity and thus a graded stiffness and thermal conductivity across the thickness of the hybrid bonding layer 130. The hybrid bonding layer 130, with the constant stiffness and thermal conductivity or the graded stiffness and thermal conductivity across its thickness, allows the hybrid bonding layer 130 to plastically deform and not delaminate due to the CTE mismatch between the substrate 110 and semiconductor devices 120. Also, the hybrid bonding layer 130 provides sufficient stiffness such that the semiconductor devices 120 are adequately secured to the substrate 110 for subsequent manufacturing steps performed on the semiconductor devices 120. The hybrid bonding layer 130 also provides sufficient high temperature bonding strength between the substrate 110 and semiconductor devices 120 during operating temperatures approaching and possibly exceeding 200° C.

Generally, the hybrid bonding layer 130 comprises a flat thin layer and the pair of bonding layers 134 comprise flat thin films. As non-limiting examples, the thickness of the hybrid bonding layer 130 may be between about 25 micrometers (microns) and about 200 microns. In embodiments, the hybrid bonding layer 130 has a thickness between about 50 microns and about 150 microns. In other embodiments, the hybrid bonding layer 130 has a thickness between about 75 microns and 125 microns, for example a thickness of 100 microns. The thickness of the pair of bonding layers 134 may be between 1 micron and 20 microns. In embodiments, the pair of bonding layers 134 each have a thickness between about 2 microns and about 15 microns.

The bonding layer 133B and/or the pair of bonding layers 134 may be formed using conventional multilayer thin film forming techniques illustratively including but not limited to chemical vapor depositing the bonding layer 133B on the plurality of balls 133 and/or the pair of bonding layers 134 onto the MIO layer 132, physical vapor depositing the bonding layer 133B on the plurality of balls 133 and/or the pair of bonding layers 134 onto the MIO layer 132, electrolytically depositing the bonding layer 133B on the plurality of balls 133 and/or the pair of bonding layers 134 onto the MIO layer 132, electroless depositing the bonding layer 133B on the plurality of balls 133 and/or the pair of bonding layers 134 onto the MIO layer 132, and the like.

Figure 9:
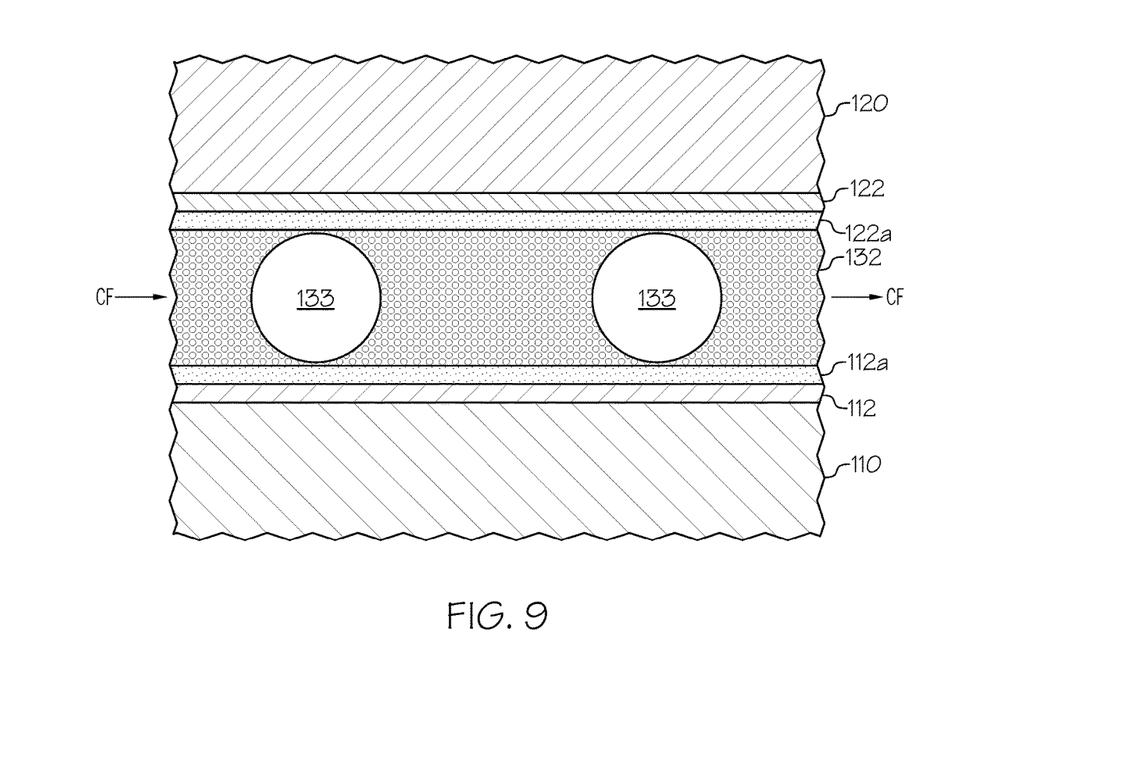
FIG. 9 schematically depicts the hybrid bonding layer in FIG. 2 transient liquid phase bonded to the power semiconductor device and the substrate.

Referring now to FIG. 9, an enlarged view of the region designated by box 150 in FIG. 1 after the semiconductor devices 120 have been TLP bonded to the substrate 110 with the hybrid bonding layer 130 depicted in FIG. 2 is schematically shown. As noted above, the MIO layer 132 includes a skeletal network of metal with a periodic arrangement of interconnected hollow spheres. Accordingly, the hybrid bonding layer 130 has a porous structure, and in embodiments, a cooling fluid 'CF' may flow through the hybrid bonding layer 130 and provide cooling to the semiconductor devices 120. In such embodiments, the plurality of balls 133 of the BGA 131 may provide heat transfer from the semiconductor device 120 to the cooling fluid CF, i.e., the plurality of balls 133 may serve as fins in conventional cooling structures. As illustrated in FIG. 9, the hybrid bonding layer 130 remains as in FIG. 2, i.e., the plurality of balls 133 and the MIO layer 132 do not melt during the TLP bonding process and generally remain the same thickness as before the TLP bonding process. In contrast, the pair of bonding layers 134 at least partially melt, diffuse into the bonding layers 112, 122 and the MIO layer 132, and form TLP bond layers 112a and 122a. Although TLP bond layers 112a and 122a depicted in FIG. 9 have consumed the bonding layers 134, in embodiments the TLP bond layers 112a and/or 122a may not totally consume the bonding layers 134, i.e., a thin layer of the bonding layers 134 may be present after the hybrid bonding layer 130 is TLP bonded between the semiconductor devices 120 and the substrate 110. In other embodiments, both the bonding layers 134 and the bonding layers 112, 122 are consumed by the TLP bond layers 112a, 122a, i.e., only the TLP bond layers 112a and/or 122a are present between the hybrid bonding layer 130 and the substrate 110 and/or semiconductor devices 120, respectively. In still other embodiments, the TLP bond layers 112a and/or 122a may comprise no layers, i.e., all of the bonding layers 134, 112 and 122 diffuse into the MIO layer 132, substrate 110 and/or semiconductor device 120 thereby resulting in a clearly defined TLP bond layer 112a and/or 122a not being present. While FIG. 9 depicts the plurality of balls 133 without the bonding layer 133B, it should be understood that in some embodiments the plurality of balls 133 include the bonding layer 133B. In such embodiments, the bonding layer 133B at least partially melts, diffuses into the MIO layer 132, and forms a TLP bond layer between the plurality of balls 133 and the MIO layer 132.

In embodiments, the MIO layer 132 is formed from copper, i.e., the MIO layer 132 is a copper inverse opal (CIO) layer 134. In such embodiments, the pair of bonding layers 134 (and the bonding layer 133B) may be formed from Sn, the bonding layers 112, 122 may be formed from nickel (Ni), and the TLP bond layers 112a and 122a (and bond layers formed between the plurality of balls 133 and the MIO layer 132) comprise an intermetallic layer of Cu and Sn. In some embodiments, the TLP bond layers 112a and 122a comprise an intermetallic layer of Cu, Ni and Sn. For example and without limitation, the TLP bond layers 112a and 122a may include the intermetallic $Cu_6Sn_5$, the intermetallic $(Cu, Ni)_6Sn_5$, the intermetallic $Cu_3Sn$ or a combination of the intermetallics $Cu_6Sn_5$, $(Cu, Ni)_6Sn_5$, and/or $Cu_3Sn$. It should be understood that the bonding layers 134 formed from Sn at least partially melt at the TLP sintering temperature and then isothermally solidify during the formation of the Cu—Sn intermetallic(s) since $Cu_6Sn_5$ starts to melt at 415° C. and $Cu_3Sn$ starts to melt at about 767° C. That is, a melting temperature of the TLP bond layers 112a, 122a is greater than a melting temperature of the pair of bonding layers 134.

While FIGS. 2 and 9 depict a hybrid bonding layer 130 as shown in FIGS. 5A and 5B, it should be understood that the hybrid bonding layer 130 depicted in FIGS. 7A and 7B may be used to TLP bond the semiconductor device 120 to the substrate 110.

Figure 10:
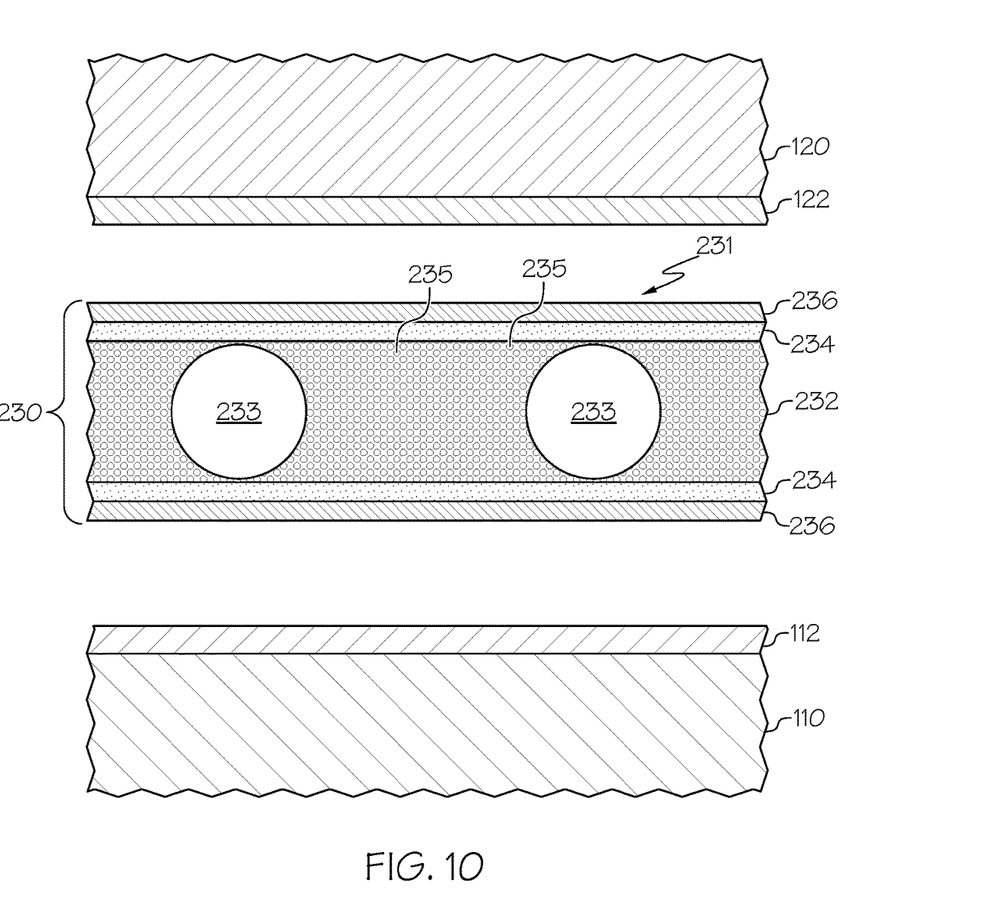
FIG. 10 schematically depicts an exploded view of the hybrid bonding layer in FIG. 1 according to one or more embodiments shown and described herein.

Referring now to FIG. 10, an exploded view of the region designated by box 150 in FIG. 1 before TLP sintering of the semiconductor devices 120 to the substrate 110 with a hybrid bonding layer 230 is schematically shown. The hybrid bonding layer 230 includes an MIO layer 232, a BGA 231 formed from a plurality of balls 233 disposed within the MIO layer 232, an MIO layer 232, a first pair of bonding layers 234, and a second pair of bonding layers 236. The MIO layer 232 has a plurality of hollow spheres 235 and a predefined porosity, that in combination with the BGA 231, provide a stiffness and thermal conductivity for the hybrid bonding layer 230. The MIO layer 232 and the BGA 231 may be disposed between and in direct contact with the first pair of bonding layers 234 and the first pair of bonding layers 234 may be disposed between and in direct contact with the second pair of bonding layers 236. In some embodiments, the plurality of balls 233 are in direct contact with at least one of the first pair of bonding layers 234. In other embodiments, the plurality of balls 233 are disposed within the MIO layer 232 such that the plurality of balls 233 are not in direct contact with at least one of the first pair of bonding layers 234.

The plurality of balls 233, the MIO layer 232, and each of the first pair of bonding layers 234 have melting points greater than a TLP sintering temperature and each of the second pair of bonding layers 236 have a melting point that is less than the TLP sintering temperature used to form a TLP bond between the substrate 110 and semiconductor devices 120. As a non-limiting example, the TLP sintering temperature is between about 280° C. and about 350° C. and each of the second pair of bonding layers 236 have a melting point less than about 280° C., and the plurality of balls 233, the MIO layer 232 and the first pair of bonding layers 234 have melting points greater than 350° C. For example, the second pair of bonding layers 236 may be formed from Sn with a melting point of about 232° C., whereas the plurality of balls 233, the MIO layer 232 and first pair of bonding layers 234 may be formed from materials such as Cu, Al, Ag, Zn, and Mg with a melting point of about 1085° C., 660° C., 962° C., 420° C. and 650° C., respectively. Accordingly, the second pair of bonding layers 236 at least partially melt and the MIO layer 232, BGA 231, and the first pair of bonding layers 234 do not melt during TLP bonding of the semiconductor devices 120 to the substrate 110.

The first pair of bonding layers 234 and the second pair of bonding layers 236 may be formed using conventional multilayer thin film forming techniques. Non-limiting examples include but are not limited to chemical vapor depositing the first pair of bonding layers 234 and the second pair of bonding layers 236 onto the MIO layer 232, physical vapor depositing the first pair of bonding layers 234 and the second pair of bonding layers 236 onto the MIO layer 232, electrolytically depositing the first pair of bonding layers 234 and the second pair of bonding layers 236 onto the MIO layer 232, electroless depositing the first pair of bonding layers 234 and the second pair of bonding layers 236 onto the MIO layer 232, and the like.

Figure 11:
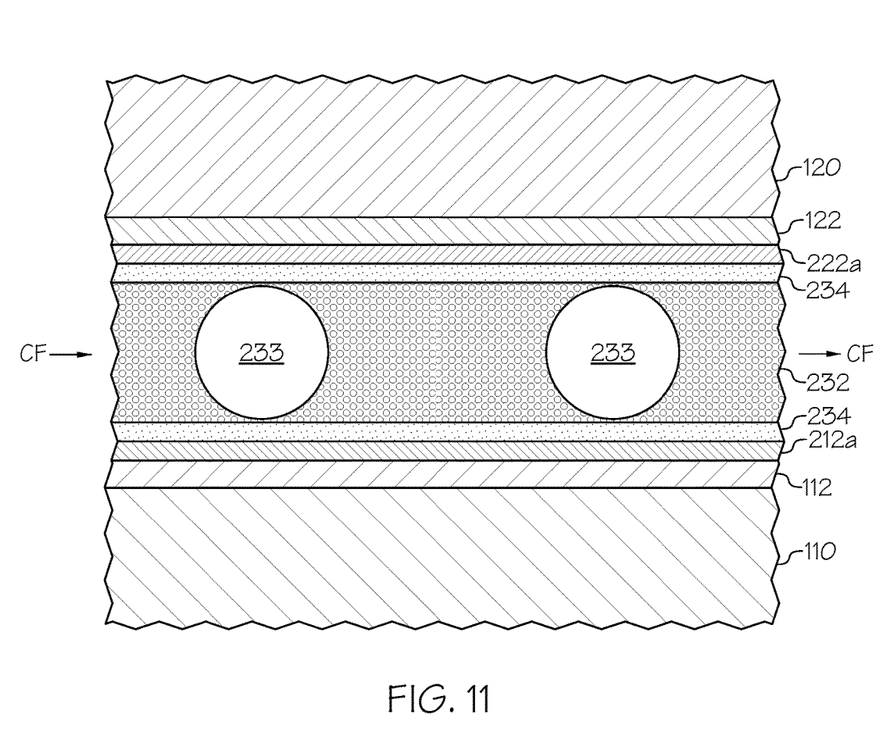
FIG. 11 schematically depicts the hybrid bonding layer in FIG. 10 transient liquid phase bonded to the power semiconductor device and the substrate.

Referring now to FIG. 11, an enlarged view of the region designated by box 150 in FIG. 1 after the semiconductor devices 120 have been TLP bonded to the substrate 110 with the hybrid bonding layer 230 is schematically depicted. Similar to the MIO layer 132, the MIO layer 232 includes a skeletal network of metal with a periodic arrangement of interconnected hollow spheres. Accordingly, the hybrid bonding layer 230 has a porous structure, and in embodiments, a cooling fluid 'CF' may flow through the hybrid bonding layer 230 and provide cooling to the semiconductor devices 120. In such embodiments, the plurality of balls 233 of the BGA 231 may provide heat transfer from the semiconductor device 120 to the cooling fluid CF, i.e., the plurality of balls 233 may serve as fins in conventional cooling structures. As illustrated in FIG. 11, after the semiconductor devices 120 have been TLP bonded to the substrate 110, the MIO layer 232 with the BGA 231 disposed there within and the first pair of bonding layers 234 remain as in FIG. 10, i.e., the MIO layer 232 with the BGA 231 disposed there within and the first pair of bonding layers 234 do not melt during the TLP bonding process and generally remain the same thickness as before the TLP bonding process. In contrast, the second pair of bonding layers 236 at least partially melt and form TLP bond layers 212a and 222a. Although TLP bond layers 212a and 222a depicted in FIG. 11 each comprise one layer, in embodiments the TLP bond layers 212a and/or 222a may comprise two or more layers between the bonding layer 112 and adjacent first bonding layer 234, and the bonding layer 122 and adjacent first bonding layer 234, respectively. In other embodiments, the TLP bond layers 212a and/or 222a may comprise no layers, i.e., all of the bonding layers 234, 112 and 122 diffuse into the MIO layer 232, plurality of balls 233, substrate 110 and/or semiconductor device 120 thereby resulting in a clearly defined TLP bond layer 212a and/or 222a not being present. While FIG. 11 depicts the plurality of balls 233 without a bonding layer, it should be understood that in embodiments the plurality of balls 233 include a bonding layer as described with respect to the plurality of balls 133 and depicted in FIG. 4. In such embodiments, the bonding layer on the plurality of balls 233 at least partially melts, diffuses into the MIO layer 232, and forms a TLP bond layer between the plurality of balls 233 and the MIO layer 232.

Figure 12:
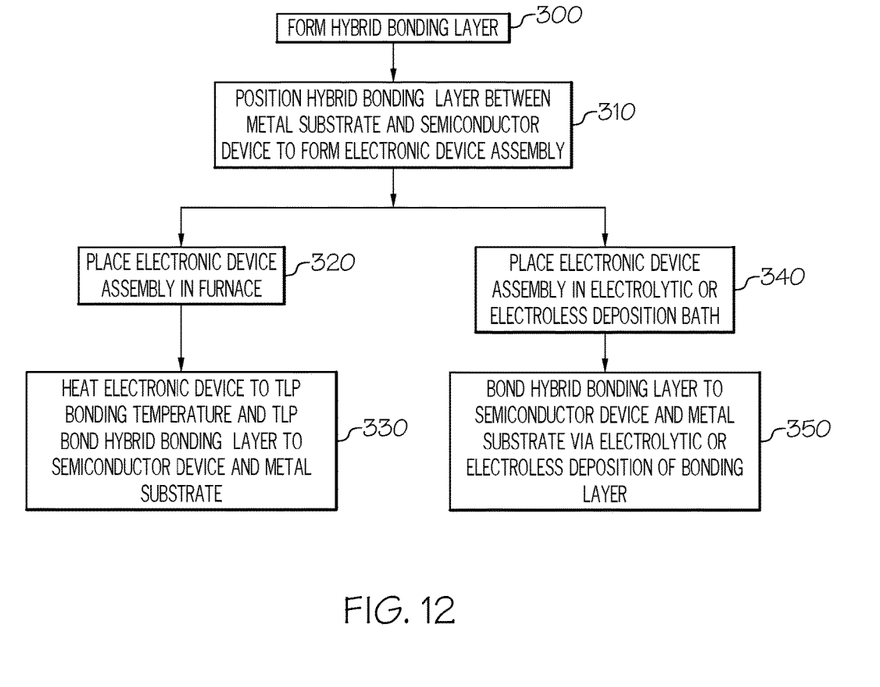
FIG. 12 schematically depicts a process of bonding a hybrid bonding layer to a power semiconductor device and a substrate according to one or more embodiments shown and described herein.

Referring now to FIG. 12, processes for bonding a power semiconductor device to a substrate with a hybrid bonding layer are depicted. Particularly, at step 300 a hybrid bonding layer is formed as described above and positioned between the substrate 110 and the semiconductor device 120 at step 310 to form an electronic device assembly. In some embodiments, the hybrid bonding layer is TLP bonded between the substrate 110 and the semiconductor device 120. In such embodiments, the hybrid bonding layer 130 is disposed between the pair of bonding layers 134 (FIG. 2), or in the alternative, the hybrid bonding layer 230 is disposed between a pair of first bonding layers 234, which are disposed between a pair of second pair of bonding layers 236 (FIG. 10). At step 310 the hybrid bonding layer 130 (or hybrid bonding layer 230) is brought into direct contact with the substrate 110 and the semiconductor device 120 to form the electronic device assembly. In some embodiments, a force F is applied to the semiconductor device 120 in order to ensure contact between the bonding layer 112, the hybrid bonding layer 130 and the bonding layer 122 is maintained during the TLP bonding process. Also, the force F may ensure the semiconductor device 120 does not move relative to the substrate 110 during the TLP bonding process. The electronic device assembly is placed in a furnace at step 320. At step 330 the electronic device assembly is heated to a TLP sintering temperature and the pair of bonding layers 134 at least partially melt and form the TLP bond layer 112a between the MIO layer 132 and the substrate 110 and the TLP bond layer 122a between the MIO layer 132 and the semiconductor 120. In embodiments where the plurality of balls 133 include the bonding layer 133B (FIG. 4), the bonding layer 133B at least partially melts and forms a TLP bond layer between the plurality of balls 133 and the MIO layer 132. After heating to the TLP sintering temperature, the substrate/semiconductor device assembly is cooled to ambient temperature. As used herein, the term "ambient temperature" refers to room temperature, e.g., to a temperature less than about 25° C. such as between about 20° C. and 22° C. It should be understood that the furnace for heating to electronic device assembly to the TLP sintering temperature may comprise an inert or reducing gas atmosphere. Illustrative examples of inert gas atmospheres include but are not limited to atmospheres of helium, argon, neon, xenon, krypton, radon and combinations thereof. Illustrative examples of reducing gas atmospheres include but are not limited to hydrogen, argon plus hydrogen, helium plus hydrogen, neon plus hydrogen, xenon plus hydrogen, krypton plus hydrogen, radon plus hydrogen, and combinations thereof.

In other embodiments, the hybrid bonding layer 130 (or hybrid bonding layer 230) is electroplate bonded or electroless plate bonded between the substrate 110 and the semiconductor device 120. In such embodiments, the electronic device assembly is placed in a electroplating bath or an electroless plating bath at step 340 and the hybrid bonding layer 130 is electroplate bonded or electroless plate bonded to the substrate 110 and the semiconductor device 120 at step 350 via electrolytic or electroless deposition of a bonding layer.

Figure 13:
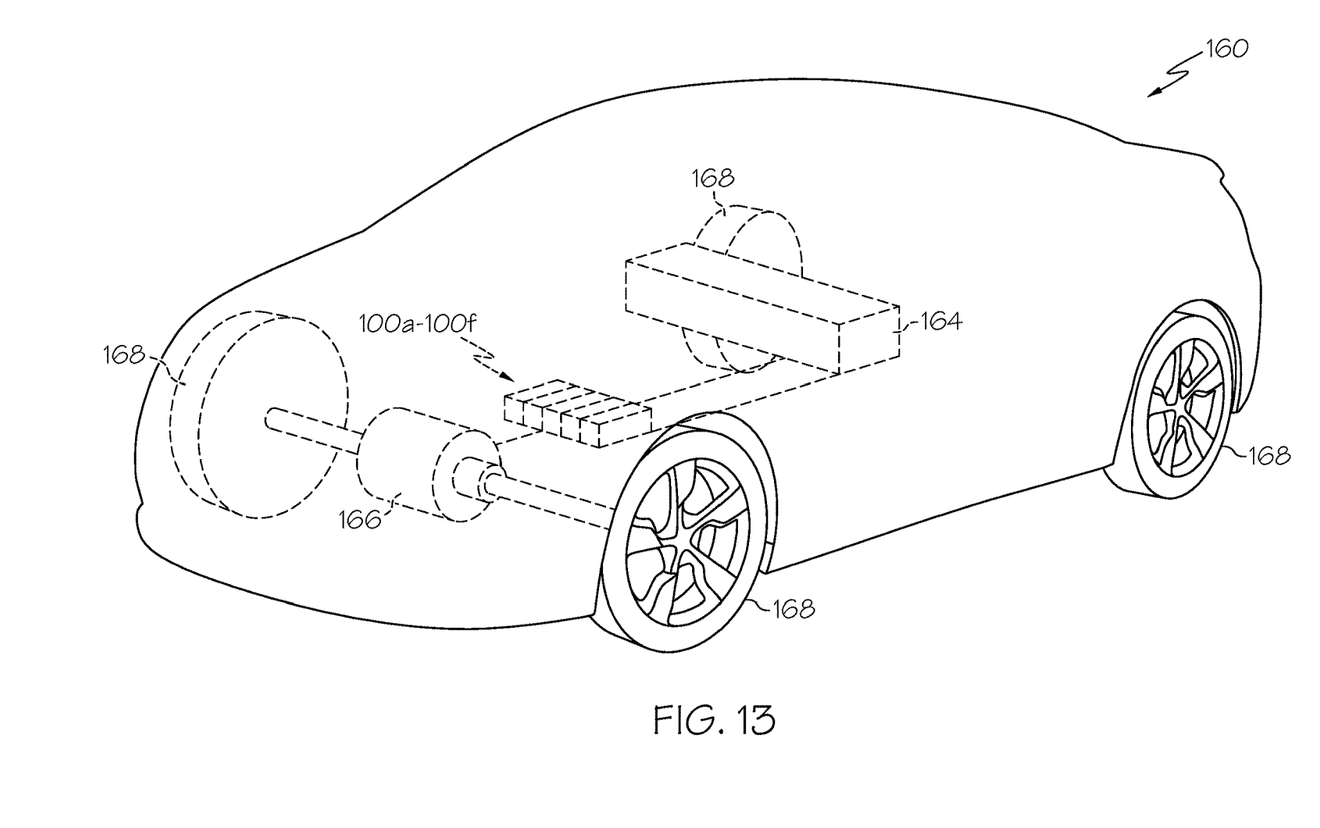
FIG. 13 schematically depicts a vehicle having a plurality of power electronics assemblies according to one or more embodiments shown and described herein.

As stated above, the substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 13, several power electronics assemblies 100a-100f may be electrically coupled together to form a drive circuit that converts direct current electrical power provided by a bank of batteries 164 into alternating current that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which require bonds between the semiconductor devices and substrates that can withstand higher temperatures and thermally-induced stresses due to CTE mismatch. The hybrid bonding layers described and illustrated herein may compensate for the thermally-induced stresses generated during thermal bonding of the semiconductor devices to the substrate and/or operation of the power semiconductor devices with a constant or graded stiffness and thermal conductivity across the thickness of the thermal stress compensation layers while also providing a compact package design.

It should now be understood that the multilayer composites incorporated into the power electronics assemblies and vehicles described herein may be utilized to compensate thermally-induced stresses due to CTE mismatch without the need for additional interface layers, thereby providing for a more compact package design with reduced thermal resistance. Particularly, the MIO layer and the BGA forming the hybrid bonding layer described herein may have a desired stiffness that compensates for the thermally induced stresses between the semiconductor device and the substrate thereby reducing or eliminating stress and failures at TLP bonds between semiconductor device, hybrid bonding layer, and substrate.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A hybrid bonding layer comprising:
a metal inverse opal (MIO) layer; and
a ball grid array (BGA) disposed within the MIO layer.

2. The hybrid bonding layer of claim 1, wherein the MIO layer comprises a copper metal inverse opal (CIO) layer.

3. The hybrid bonding layer of claim 1, wherein the BGA comprises a plurality of balls formed from at least one of aluminum, nickel, copper, manganese, and alloys thereof.

4. The hybrid bonding layer of claim 1, wherein the BGA comprises a plurality of balls disposed in the MIO layer uniformly or non-uniformly.

5. The hybrid bonding layer of claim 1, wherein the BGA comprises a plurality of core-shell balls with a core formed from at least one of aluminum, nickel, copper, manganese, and alloys thereof, and a shell formed from at least one of aluminum, nickel, copper, manganese, tin, and alloys thereof.

6. The hybrid bonding layer of claim 5, wherein the shell is formed from tin and alloys thereof.

7. The hybrid bonding layer of claim 1, further comprising a pair of low melting point bond layers, wherein the MIO layer and the BGA disposed within the MIO layer are positioned between the pair of low melting point bond layers.

8. The hybrid bonding layer of claim 7, wherein the pair of low melting point bond layers comprise a melting point below a TLP sintering temperature and the MIO layer and the BGA each have a melting point above the TLP sintering temperature.

9. The hybrid bonding layer of claim 8, wherein the pair of low melting point bond layers are formed from tin and alloys thereof.

10. A power electronics assembly comprising:
a substrate;
a semiconductor device; and
a hybrid bonding layer disposed between and bonded to the semiconductor device and the substrate, the hybrid bonding layer comprising a metal inverse opal (MIO) layer and a ball grid array (BGA) disposed within the MIO layer.

11. The power electronics assembly of claim 10, wherein the MIO layer comprises a copper metal inverse opal (CIO) layer.

12. The power electronics assembly of claim 10, wherein the BGA comprises a plurality of balls formed from at least one of aluminum, nickel, copper, manganese, and alloys thereof.

13. The power electronics assembly of claim 12, further comprising an intermetallic layer between the MIO layer and at least one of the plurality of balls.

14. The power electronics assembly of claim 12, wherein the plurality of balls are disposed in the MIO layer uniformly or non-uniformly.

15. The power electronics assembly of claim 12, further comprising a cooling fluid flowing within the hybrid bonding layer, wherein the plurality of balls are configured to transfer heat from the substrate to the cooling fluid.

16. The power electronics assembly of claim 10, further comprising a first intermetallic layer between the hybrid bonding layer and the substrate and a second intermetallic layer between the hybrid bonding layer and the semiconductor device.

17. A process for manufacturing a power electronics assembly comprising:
positioning a hybrid bonding layer between a substrate and a semiconductor device to provide a substrate/semiconductor device assembly, the hybrid bonding layer comprising a metal inverse opal (MIO) layer and a ball grid array (BGA) disposed within the MIO layer;
heating the substrate/semiconductor device assembly to a transient liquid phase (TLP) sintering temperature between about 280° C. and 350° C. and TLP bonding the hybrid bonding layer between and to the substrate and the semiconductor device; and
cooling the substrate/semiconductor device assembly from the TLP sintering temperature to ambient temperature.

18. The process of claim 17, wherein the BGA comprises a plurality of balls and the MIO layer is formed around the plurality of balls.

19. The process of claim 17, further comprising forming the MIO layer with a plurality of hollow spaces for the BGA to be positioned within and positioning the BGA within the plurality of hollow spaces to form the hybrid bonding layer.

20. The process of claim 17, wherein:
the hybrid bonding layer is positioned between a pair of low melting point bond layers;
the pair of low melting point bond layers have a melting point less than 280° C.; and
the pair of low melting point bond layers at least partially melt and isothermally solidify during heating of the substrate/semiconductor device assembly to the TLP sintering temperature.

* * * * *